United States Patent
Wagoner et al.

(10) Patent No.: US 10,104,814 B2
(45) Date of Patent: Oct. 16, 2018

(54) SYSTEM AND METHOD FOR COOLING ELECTRICAL COMPONENTS OF A POWER CONVERTER

(71) Applicant: General Electric Company, Schenectady, NY (US)

(72) Inventors: Robert Gregory Wagoner, Roanoke, VA (US); Paul Stephen Pate, Troutville, VA (US); Harold Robert Schnetzka, Simpsonville, SC (US)

(73) Assignee: General Electric Company, Schenectady, NY (US)

( * ) Notice: Subject to any disclaimer, the term of this patent is extended or adjusted under 35 U.S.C. 154(b) by 579 days.

(21) Appl. No.: 14/531,128

(22) Filed: Nov. 3, 2014

(65) Prior Publication Data
US 2016/0128231 A1    May 5, 2016

(51) Int. Cl.
*H05K 7/20*      (2006.01)

(52) U.S. Cl.
CPC ......... *H05K 7/20927* (2013.01); *H05K 7/203* (2013.01); *H05K 7/20236* (2013.01); *H05K 7/20272* (2013.01); *H05K 7/20936* (2013.01)

(58) Field of Classification Search
CPC ........ H05K 7/20236; H05K 7/20927–7/20936
See application file for complete search history.

(56) References Cited

U.S. PATENT DOCUMENTS

| | | | | |
|---|---|---|---|---|
| 2,479,373 A | * | 8/1949 | Knotts | H01F 27/14 165/103 |
| 2,615,075 A | * | 10/1952 | Paluev | H01F 27/14 137/395 |
| 2,682,173 A | * | 6/1954 | Camilli | H02H 5/06 174/15.1 |
| 2,917,701 A | * | 12/1959 | Salton | H01F 27/12 336/57 |

(Continued)

FOREIGN PATENT DOCUMENTS

| | | |
|---|---|---|
| EP | 2734020 A1 | 5/2014 |
| EP | 2767783 A1 | 8/2014 |

(Continued)

OTHER PUBLICATIONS

3M(TM) Novec(TM) 7000 Engineered Fluid Product Information, 3M Electronics Markets MAterials Division, Sep. 2009, 6 pages.*

(Continued)

*Primary Examiner* — Robert J Hoffberg
(74) *Attorney, Agent, or Firm* — Dority & Manning, P.A.

(57) ABSTRACT

Systems and methods for cooling one or more electrical components of a current conversion device of a renewable energy power system (e.g. a wind turbine or a solar power system) are disclosed. In one embodiment, the system includes an immersion tank comprising a cooling medium, a heat exchanger, and a pumping device. One or more of the electrical components are at least partially submerged within the cooling medium, which has a predetermined dielectric constant. The heat exchanger is in fluid communication with (Continued)

the cooling medium of the immersion tank. Thus, the pumping device is configured to circulate the cooling medium between the immersion tank and the heat exchanger to remove heat from the one or more electrical components.

8 Claims, 8 Drawing Sheets

(56) References Cited

U.S. PATENT DOCUMENTS

| | | | | |
|---|---|---|---|---|
| 3,371,299 | A * | 2/1968 | Radkowski | H01F 27/12 336/57 |
| 3,579,162 | A * | 5/1971 | Savkar | H01F 27/12 165/104.31 |
| 3,646,400 | A | 2/1972 | Demarest et al. | |
| 3,663,910 | A * | 5/1972 | Grubb | H01F 27/12 336/57 |
| 3,902,146 | A * | 8/1975 | Muralidharan | H01F 27/322 336/57 |
| 4,302,793 | A * | 11/1981 | Rohner | H05K 7/20236 174/15.1 |
| 4,590,538 | A * | 5/1986 | Cray, Jr. | H05K 7/20236 361/700 |
| 4,904,972 | A * | 2/1990 | Mori | H01F 27/02 336/55 |
| 4,927,547 | A * | 5/1990 | Backman | B01D 29/114 134/10 |
| 5,477,706 | A | 12/1995 | Kirol et al. | |
| 5,508,672 | A * | 4/1996 | Sokai | H01F 27/322 336/57 |
| 7,403,392 | B2 * | 7/2008 | Attlesey | G06F 1/20 165/104.33 |
| 7,414,845 | B2 * | 8/2008 | Attlesey | G06F 1/185 165/104.33 |
| 7,724,517 | B2 * | 5/2010 | Attlesey | G06F 1/181 165/80.4 |
| 7,911,782 | B2 * | 3/2011 | Attlesey | G06F 1/20 165/104.33 |
| 8,000,102 | B2 * | 8/2011 | Johnston | B03C 3/68 336/65 |
| 8,009,419 | B2 * | 8/2011 | Attlesey | G06F 1/20 165/104.33 |
| 8,052,383 | B2 * | 11/2011 | Frokjaer | F03D 80/60 415/178 |
| 8,699,225 | B2 * | 4/2014 | Brandenburg | H05K 7/20927 165/104.33 |
| 9,414,520 | B2 * | 8/2016 | Campbell | H05K 7/20236 |
| 9,531,247 | B2 * | 12/2016 | Kuznetsov | H01F 27/18 |
| 9,894,815 | B1 | 2/2018 | Waddell et al. | |
| 2005/0131504 | A1 * | 6/2005 | Kim | A61F 7/007 607/104 |
| 2008/0307817 | A1 * | 12/2008 | Roesner | F28D 15/00 62/259.2 |
| 2009/0097205 | A1 | 4/2009 | Matsushima et al. | |
| 2009/0269521 | A1 * | 10/2009 | Tuma | C23C 18/08 428/32.74 |
| 2015/0219874 | A1 * | 8/2015 | Figueredo | G02B 7/1815 359/845 |
| 2017/0318711 | A1 | 11/2017 | Wagoner et al. | |

FOREIGN PATENT DOCUMENTS

| | | |
|---|---|---|
| EP | 2833084 A1 | 2/2015 |
| WO | WO 2017/200551 A1 | 11/2017 |

OTHER PUBLICATIONS

Internet Article—"3M's New Computer Coolant Could Cut Energy Costs at Data Centers", Star Tribune, Apr. 9, 2014, www.startribune.com/business/254371931.html.

* cited by examiner

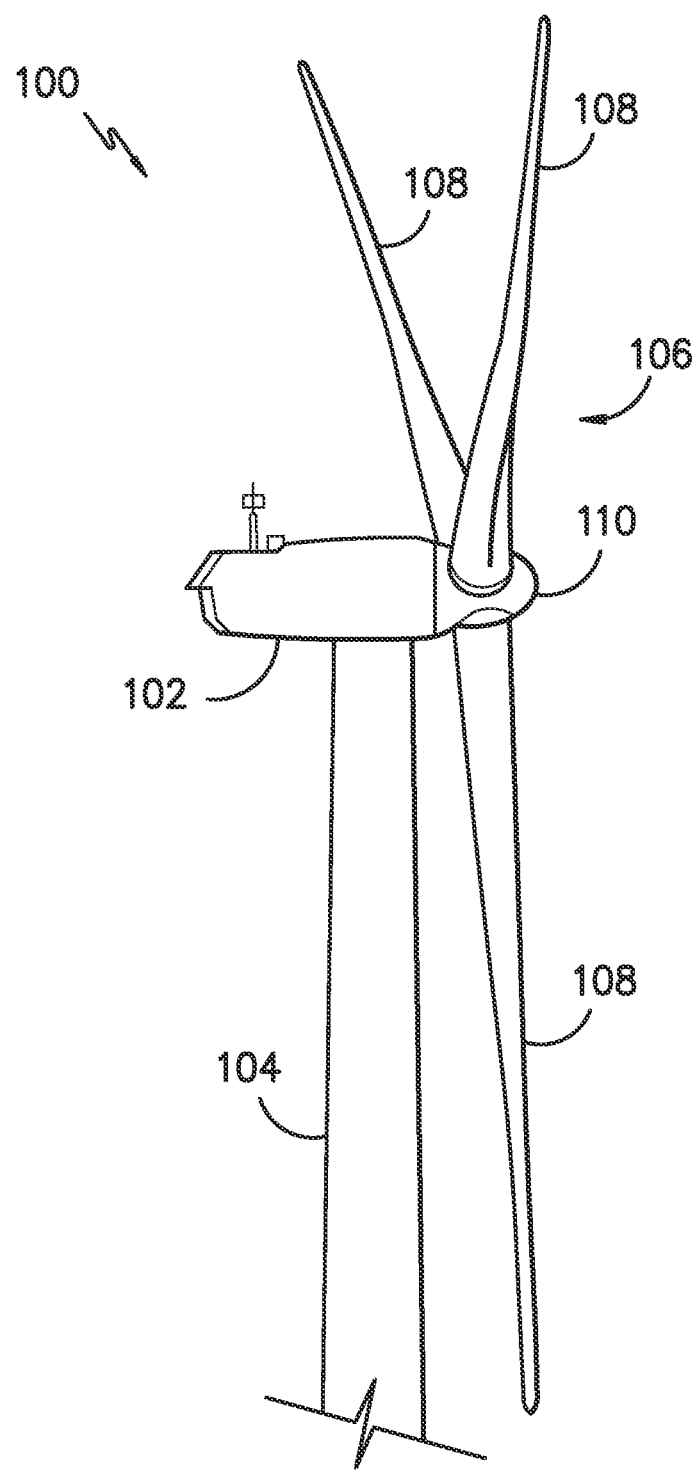
FIG. -1-

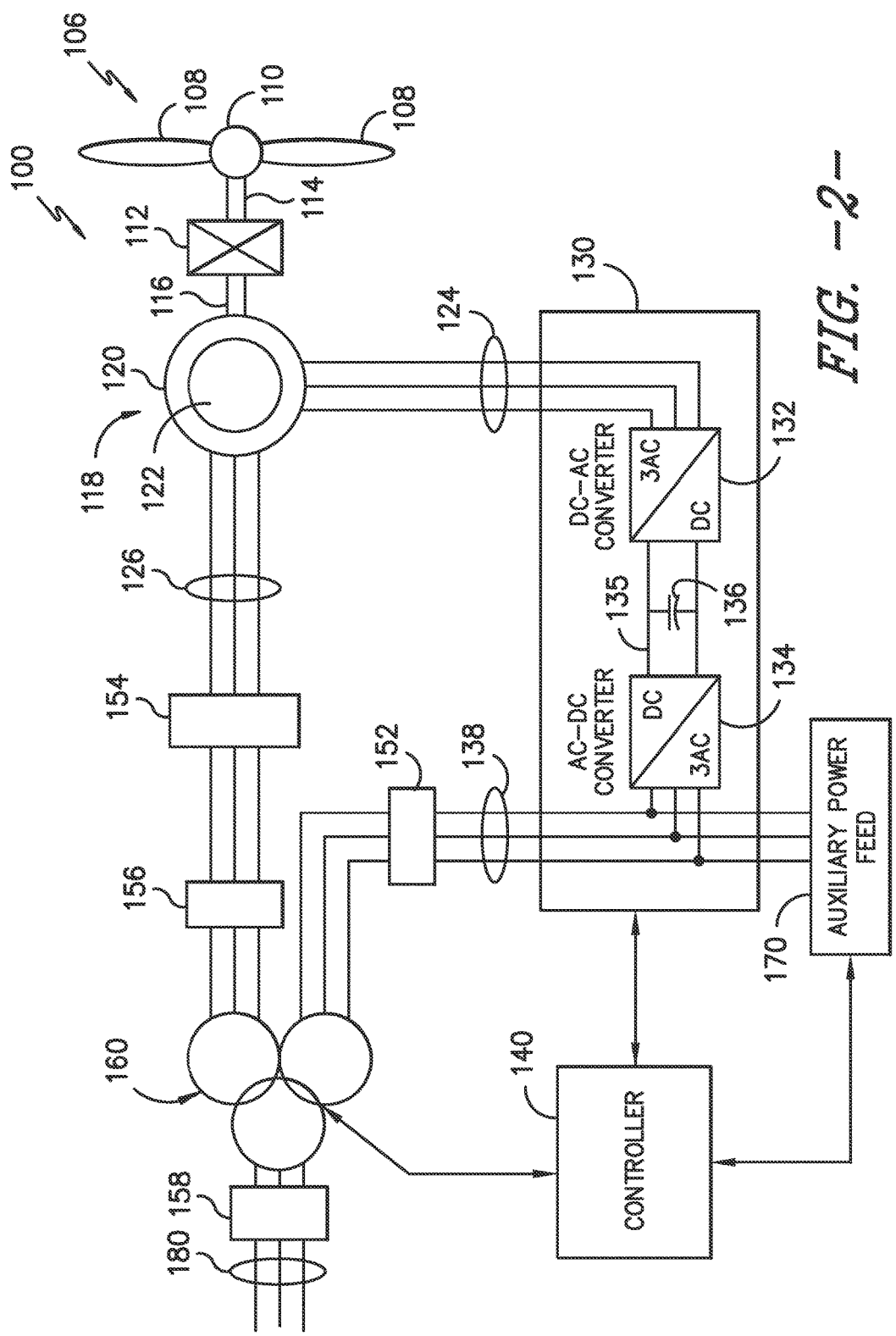
FIG. -2-

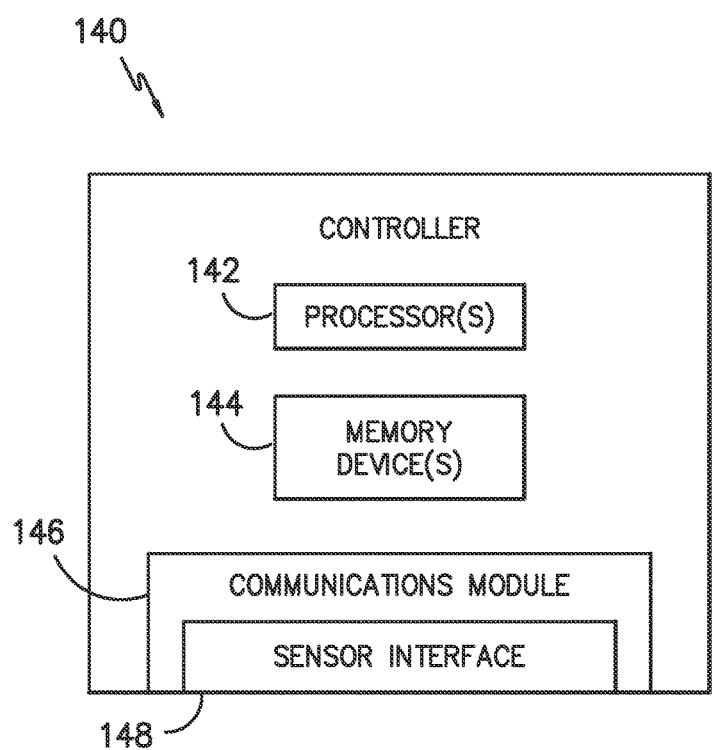
FIG. -3-

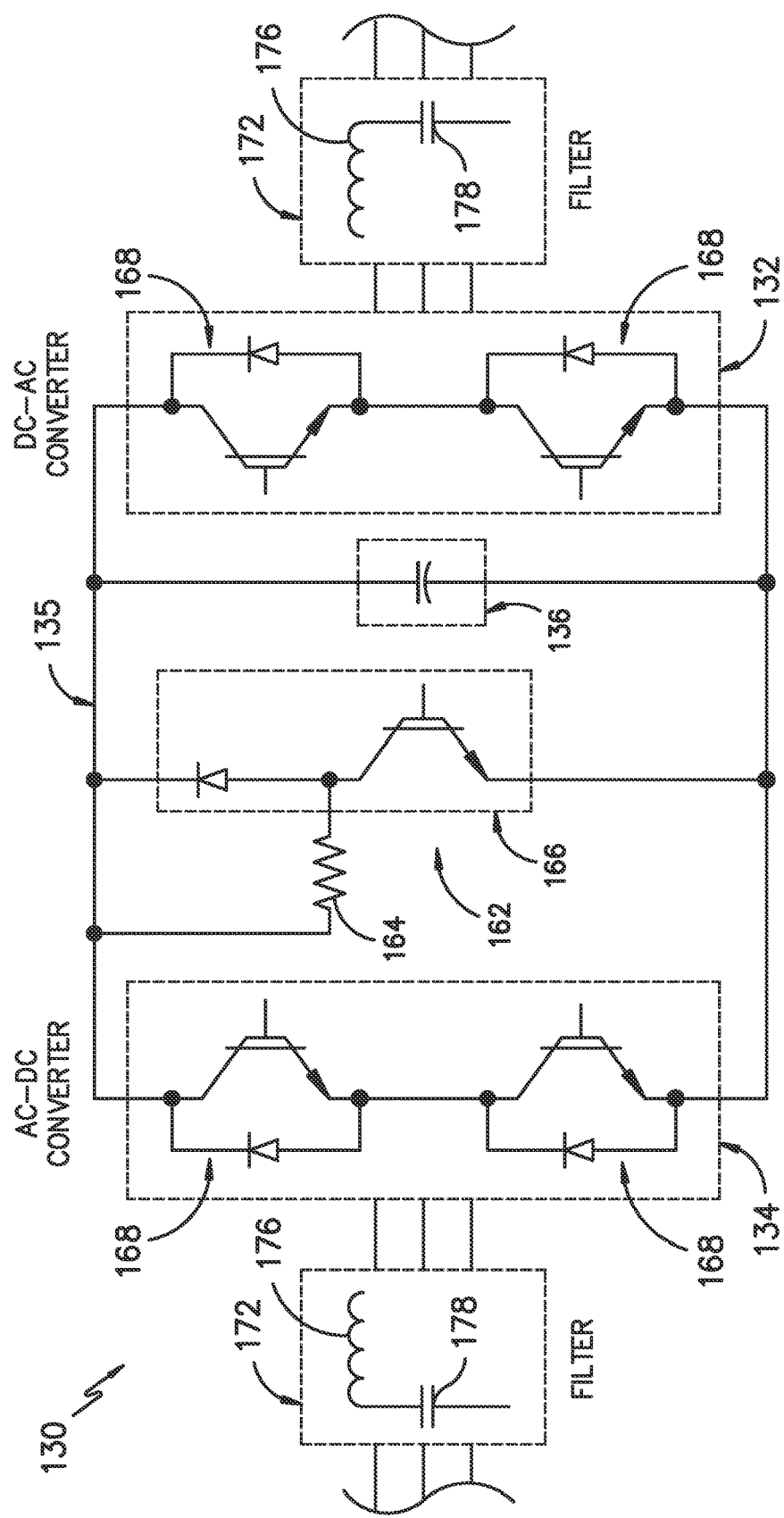
FIG. -4-

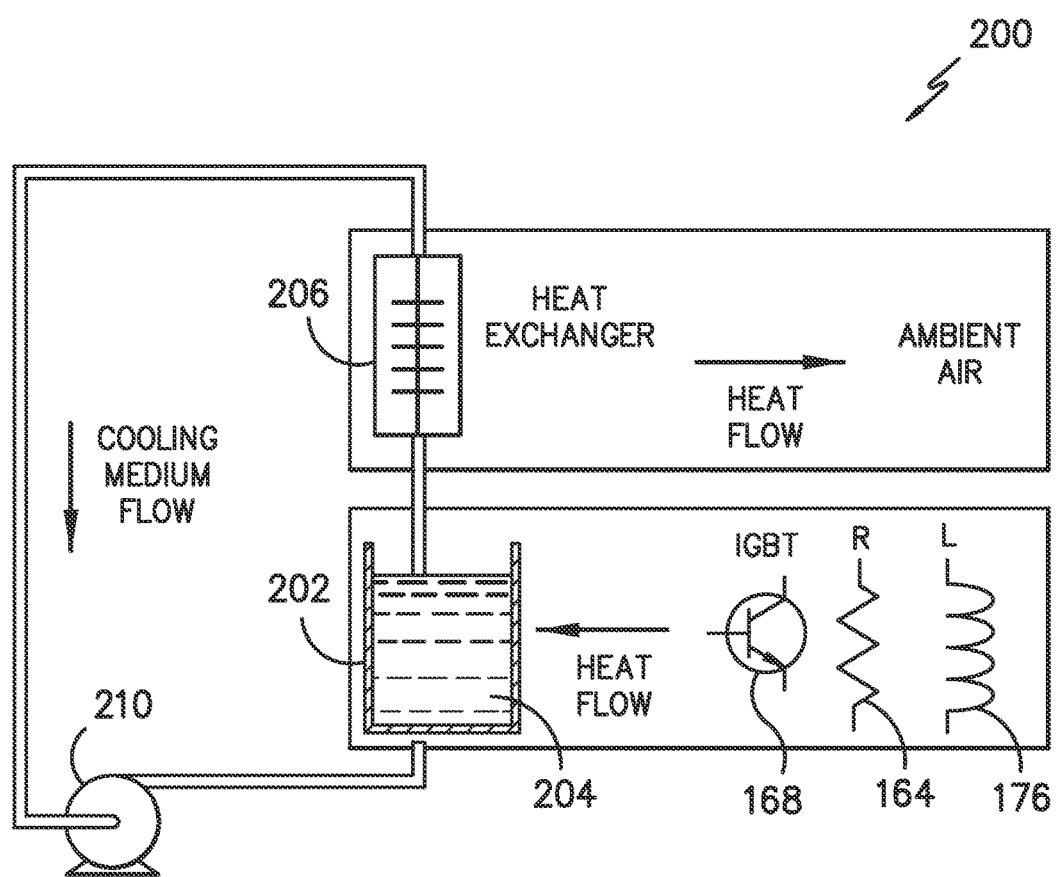
FIG. -5-

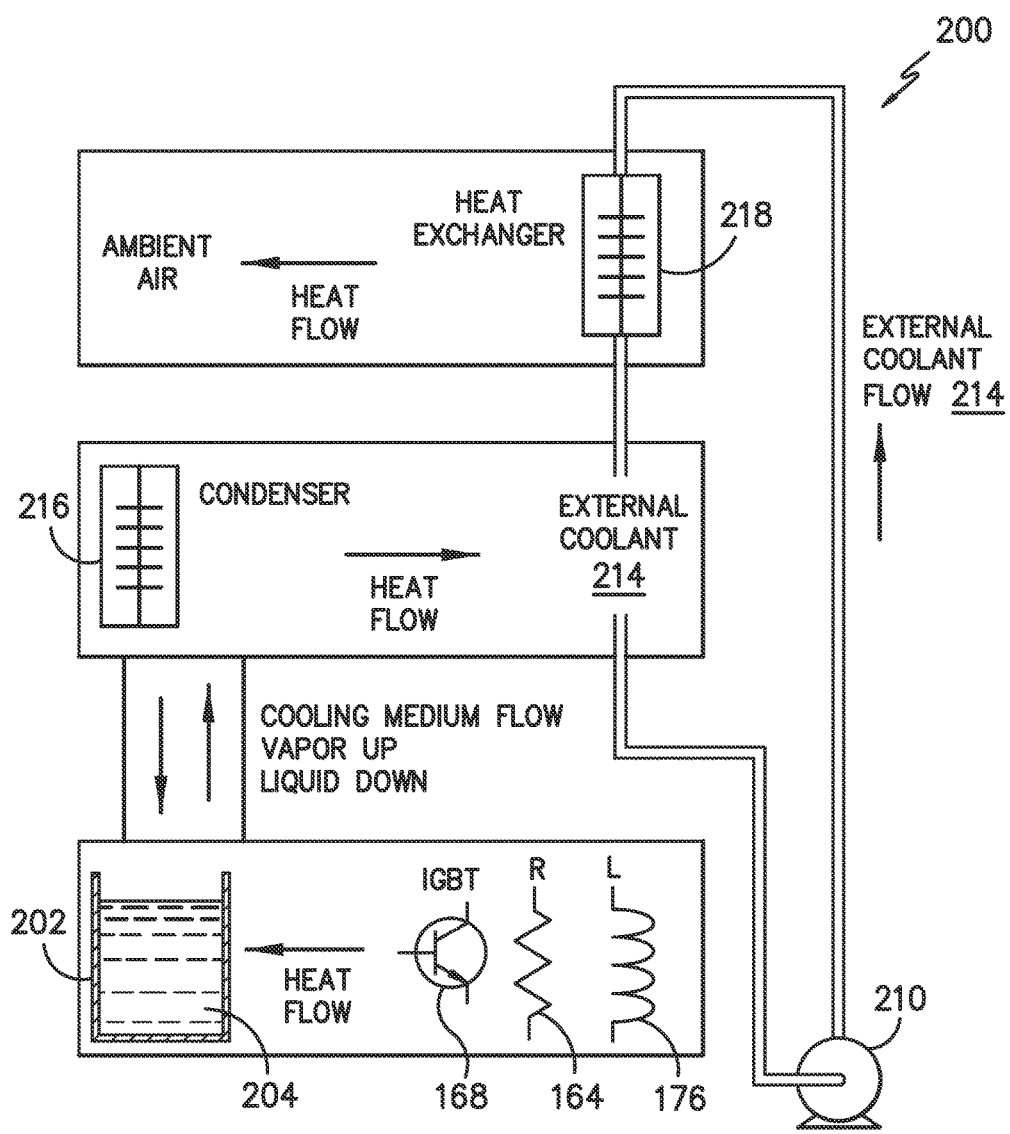
FIG. -6-

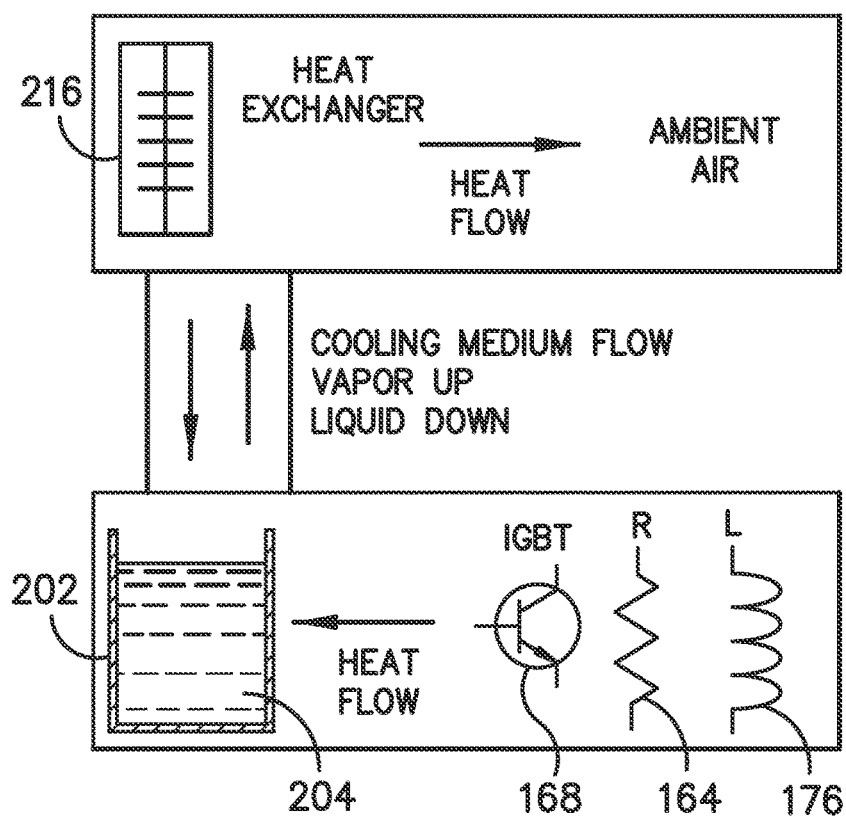
FIG. -7-

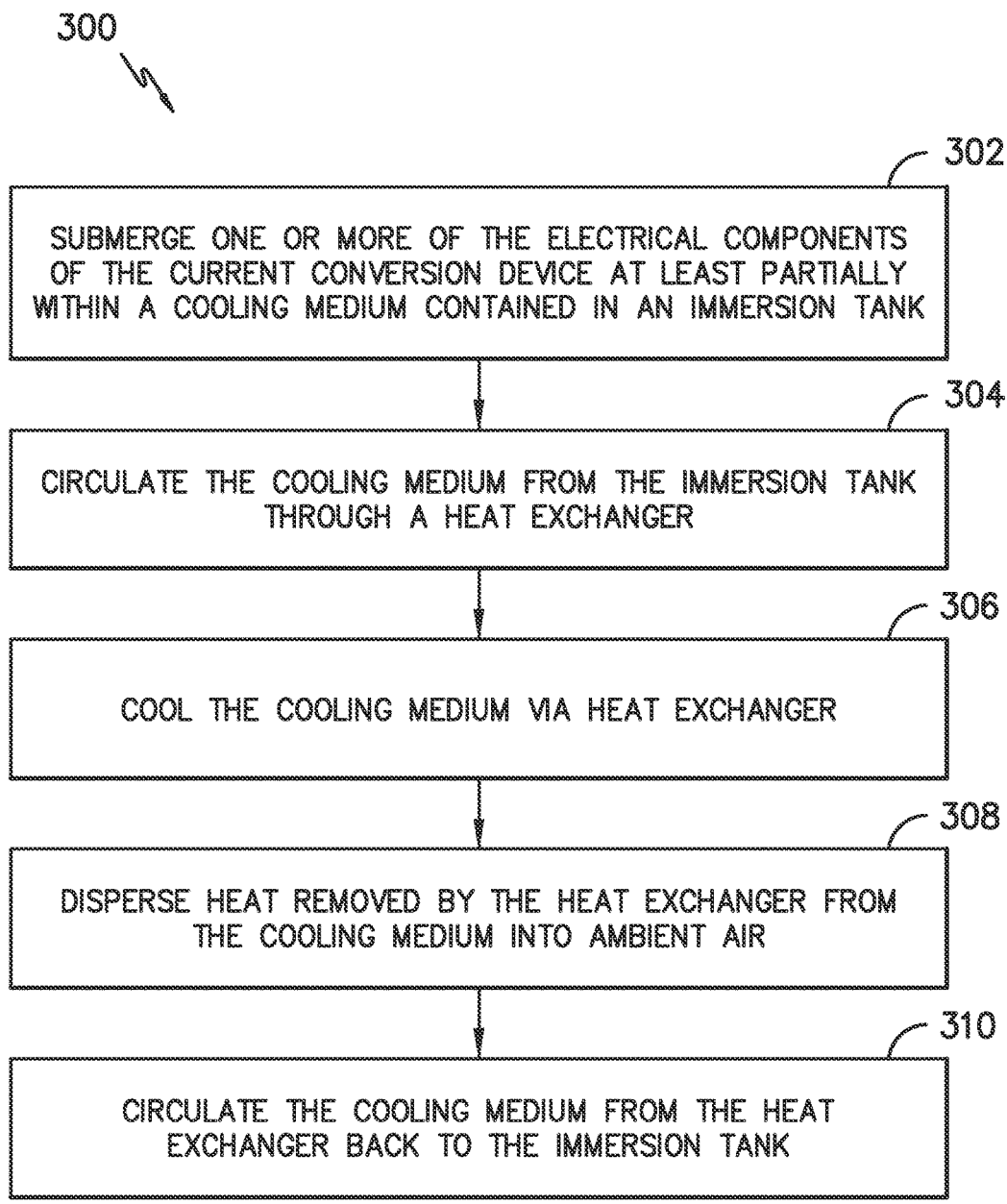
FIG. -8-

SYSTEM AND METHOD FOR COOLING ELECTRICAL COMPONENTS OF A POWER CONVERTER

FIELD OF THE INVENTION

The present invention relates generally to the field of power converters, and more particularly, to systems and methods for cooling electrical components of power converters, such as, for example, inductors, IGBTs, capacitors, and/or power resistors.

BACKGROUND OF THE INVENTION

Wind power is considered one of the cleanest, most environmentally friendly energy sources presently available, and wind turbines have gained increased attention in this regard. A modern wind turbine typically includes a tower, a nacelle rotatably supported on the tower, a generator and gearbox housed in the nacelle, and a rotatable hub having one more rotor blades. The rotor blades capture kinetic energy from wind using known foil principles, and transmit the kinetic energy through rotational energy to turn a shaft that couples the rotor blades to the gearbox, or if a gearbox is not used, directly to the generator. The generator then converts the mechanical energy to electrical energy that may be deployed to a utility grid. With the growing interest in wind-generated electricity, considerable efforts have been made to develop wind turbines that are reliable and efficient.

A wind turbine comprises several mechanical and electrical components that generate heat energy losses during their operation. These components include, for example, the gearbox (if provided) and generator that are typically housed in the nacelle. Other heat-generating components may be housed in the tower. For example, a converter and a transformer are typically located in the tower and are utilized to feed electrical energy converted from the mechanical energy of the rotor via the generator into the grid. In addition, one or more controllers for controlling operation of the wind turbine are typically arranged within the tower.

Due to the increased performance and size of modern wind turbines, effective cooling of the above-mentioned components is increasingly difficult, particularly with respect to the heat-generating components within the tower. For example, it has been estimated that for a converter control system operating in a 1.5 MW turbine, about 20 kW is dissipated in heat by the converter. Placement of the converter within the turbine tower without adequate cooling can result in a significant temperature rise within the tower, which may be detrimental to the control system and other components within the tower.

Typically, the heat-generating components in the tower are arranged within a cooling airstream generated by fans. The components may include a heat exchanger that collects the generated heat, with the heat exchanger placed directly in the airstream. The heated air rises in the tower and is typically exhausted through vents near the top of the tower. The tower may include additional vents, for example in the tower entry door, to allow the passage of outside air into the lower portion of the tower. However, even with this type of arrangement, it is often difficult to feed enough external air into the tower for sufficient cooling of the components.

Further, rejecting waste heat from the power components using current cooling systems and methods is expensive. In addition, restrictions on tower cooling may also result from geographic location of the wind turbines. For example, offshore and near-shore sites generally do not rely on external air as a cooling medium due to the high salt content and humidity of the air, which would result in a corrosive environment within the tower. These sites use an isolated cooling system, such as an air conditioning system with a heat exchanger. A dehumidifier may also be utilized. Humidity and external temperature are considerations that may significantly limit the available cooling options in a given geographical location.

In other areas of technology, such as computer processing, various cooling techniques utilize cooling fluids to cool electrical components of the system. For example, the electrical components of the computer are submerged in an immersion cooling bath so that the system maintains a suitable operating temperature. Such systems, however, are much smaller than wind turbine systems, operate at a much lower voltage (e.g. 5, 12, or 15 VDC as compared to 1300 VDC and/or 120 or 230 VAC as compared to 690 VAC), are typically located indoors where air conditioning units are present, and are not limited to certain space limitations (i.e. within the wind turbine tower or nacelle).

Accordingly, there exists a need for an improved system and method for cooling electrical components of the power converter of the wind turbine that takes into account the design considerations above. More specifically, a system and method that utilizes an immersion cooling bath to cool such components during operation, thereby eliminating the need for fans and/or air conditioning units would be advantageous.

BRIEF DESCRIPTION OF THE INVENTION

Aspects and advantages of the invention will be set forth in part in the following description, or may be obvious from the description, or may be learned through practice of the invention.

In accordance with aspects of the invention, a method for cooling one or more electrical components of a current conversion device (e.g. a power converter or a power inverter) of a renewable energy power system (e.g. a wind turbine or a solar power system) is disclosed. The system includes an immersion tank containing a cooling medium, a heat exchanger, and a pumping device. One or more of the electrical components are at least partially submerged within the cooling medium. The heat exchanger is in fluid communication with the cooling medium of the immersion tank. Thus, the pumping device is configured to circulate the cooling medium between the immersion tank and the heat exchanger to remove heat from the one or more electrical components.

In one embodiment, the pumping device is configured to circulate the cooling medium from the immersion tank through the heat exchanger such that the heat exchanger disperses the heat removed from the one or more electrical components into ambient air locally. The pumping device can then circulate the cooled cooling medium back to the immersion tank.

In certain embodiments, the electrical components may be any electrical components of the renewable energy system. For example, in one embodiment, the electrical components are part of the power inverter or the power converter, and may include, at least one of an insulated-gate bipolar transistor (IGBT), a power resistor, an inductor, a capacitor, or similar. In still further embodiments, the pumping device may be any suitable pump, including but not limited to a fixed-speed pump or a variable-speed pump.

In particular embodiments, the cooling medium and the submerged electrical components of the present disclosure have a higher critical heat flux than similar components known in the art. For example, in one embodiment, the cooling medium has a critical heat flux of at least about 10 $W/cm^2$ such that the submerged electrical components require a critical heat flux of at least about 35 $W/cm^2$. In additional embodiments, the cooling medium may have a dielectric strength of at least 10 megavolts per meter (MV/m). In other words, in certain embodiments, the dielectric strength is high enough to allow reduced electrical spacing of the electrical components as compared to air-cooled systems. Further, the dielectric strength can be controlled by isolation and/or cooling medium compatibility.

In further embodiments, the system may also include one or more fans configured to assist with start-up of the system in cold weather climates. In addition, the system may also include one or more heaters configured to heat the immersion tank and/or other components of the system (e.g. the cooling medium) upon start-up of the system in cold weather climates. In addition, the heater(s) ensure that the system is warm enough to operate a two-phase cooling regime.

In another aspect, the present disclosure is directed to a method for cooling one or more electrical components of a current conversion device of a renewable energy power system. The method includes submerging one or more of the electrical components of the current conversion device at least partially within a cooling medium contained in an immersion tank. The method also includes circulating the cooling medium from the immersion tank through a heat exchanger. Another step includes cooling the cooling medium via the heat exchanger. Still a further step includes dispersing heat removed by the heat exchanger from the cooling medium into ambient air. It should be understood that the method may also include any of the additional steps and/or features as described herein.

For example, in certain embodiments, the heat exchanger may be configured above the immersion tank such that vapor generated by the cooling medium rises to the heat exchanger from the immersion tank. Thus, the heat exchanger is configured to disperse heat removed from the one or more electrical components into ambient air locally. Alternatively, the method may include circulating an external coolant from the heat exchanger to an additional heat exchanger, wherein the additional heat exchanger disperses heat removed from the one or more electrical components into ambient air remotely.

In yet another aspect, the present disclosure is directed to a system for cooling one or more electrical components of a current conversion device of a renewable energy power system. The system includes an immersion tank containing a cooling medium, first and second heat exchangers, and a pumping device. At least one of the electrical components is at least partially submerged within the cooling medium. The first heat exchanger is in fluid communication with the cooling medium of the immersion tank. The second heat exchanger is in fluid communication with an external coolant. The pumping device is configured to circulate the external coolant between the first and second heat exchangers so as to remove heat from the one or more electrical components. Further, the second heat exchanger disperses heat removed from the one or more electrical components into ambient air. It should be understood that the power conversion assembly may also include any of the additional features as described herein.

These and other features, aspects and advantages of the present invention will become better understood with reference to the following description and appended claims.

BRIEF DESCRIPTION OF THE DRAWING

A full and enabling disclosure of the present invention, including the best mode thereof, is set forth in the specification, which makes reference to the appended drawings, in which:

FIG. 1 illustrates a perspective view of a wind turbine according to the present disclosure;

FIG. 2 illustrates a schematic diagram of one embodiment of an electrical and control system of a wind turbine according to the present disclosure;

FIG. 3 illustrates a block diagram of one embodiment of a controller of a wind turbine according to the present disclosure;

FIG. 4 illustrates a schematic diagram of one embodiment of a power converter of a wind turbine according to the present disclosure;

FIG. 5 illustrates a schematic diagram of one embodiment of a system for cooling one or more electrical components of a power converter of a wind turbine according to the present disclosure;

FIG. 6 illustrates a schematic diagram of another embodiment of a system for cooling one or more electrical components of a power converter of a wind turbine according to the present disclosure;

FIG. 7 illustrates a schematic diagram of still another embodiment of a system for cooling one or more electrical components of a power converter of a wind turbine according to the present disclosure; and FIG. 8 illustrates a flow diagram of one embodiment of a method for cooling one or more electrical components of a power converter of a wind turbine according to the present disclosure.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment, can be used with another embodiment to yield a still further embodiment. Thus, it is intended that the present invention encompass such modifications and variations as come within the scope of the appended claims and their equivalents.

Generally, the present disclosure is directed to systems and methods for cooling electrical components of current conversion device (e.g. a power converter or inverter of a wind turbine or solar power system). In a particular embodiment, the current conversion device as described herein operates with 690 VAC input with some areas at 1300 VDC. In addition, the system is designed for a 20-year life. In one embodiment, the system includes an immersion tank or bath of cooling medium, a heat exchanger, and a pumping device. One or more of the electrical components of the power converter are at least partially submerged within the cooling medium and remain submerged during operation of the power converter. Thus, the pumping device circulates the cooling medium between the immersion tank and the heat exchanger to remove heat from the one or more electrical components and disperse the heat into ambient air locally. In an alternative embodiment, the pumping device may be omitted from the system. In additional embodiments, the system may include an additional heat exchanger having a separate external coolant. Thus, the additional heat exchanger is configured to disperse heat into ambient air remotely.

The present disclosure provides many advantages not present in the prior art. For example, the costs of the high-power dissipating components are reduced by directly submerging the components into the cooling fluid. In addition, the size of the electrical components can be significantly reduced with direct cooling fluid immersion. Thus, the power components can operate at lower temperatures, thereby improving their reliability. Moreover, additional system costs may be reduced by eliminating the need for separate fans and/or multiple redundant cooling components of the converters. Further, the system and method of the present disclosure improves cooling efficiency and reduces existing auxiliary losses from pumps and fans.

Referring now to the drawings, FIG. 1 illustrates a perspective view of one embodiment of a horizontal axis wind turbine 100 according to the present disclosure. The present invention, however, can also be employed with any configuration of wind turbine, including for example a vertical axis wind turbine. As shown, the wind turbine 100 includes a tower 104 extending from a foundation (not shown), a nacelle 102 mounted on the tower 104, and a rotor 106 coupled to the nacelle 102. The rotor 106 includes a rotatable hub 110 and at least one rotor blade 108 coupled to and extending outwardly from the hub 110. For example, in the illustrated embodiment, the rotor 106 includes three rotor blades 108. However, in an alternative embodiment, the rotor 106 may include more or less than three rotor blades 108. Each rotor blade 108 may be spaced about the hub 110 to facilitate rotating the rotor 106 to enable kinetic energy to be transferred from the wind into usable mechanical energy, and subsequently, electrical energy.

The tower 104 is often manufactured as a tubular steel structure, and may be erected by stacking multiple tower segments on top of each other. Towers may also be of the lattice (or truss) type, and tubular towers may alternatively be formed of concrete or other suitable materials. The nacelle 102 typically houses the drive train (e.g., gearbox, shafts, couplings, generator, etc.), as well as a main frame (also called a "bedplate") and yaw drives. Other items, such as the control and power electronics of FIG. 2, may also be housed within the tower 104. Typically, the nacelle 102 has an outer skin that is comprised of a lightweight material, such as fiberglass or graphite composite, that functions to protect the drive train and other components from the elements (e.g., rain, ice, snow, etc.).

Various control and power electronics may be located within the wind turbine 100, for example within the tower 104. The control electronics may control the various operating modes (e.g., blade pitch angle, start-up or shut-down sequence, etc.) of the wind turbine 100. The power electronics may include transformers and converters used to transform the voltage output of the generator into the proper form for transmission onto the electrical grid. While housing the control and power electronics within the tower 104 is a typical implementation, it is not the only possible configuration. These components could also be placed in the nacelle 102. It should thus be appreciated that the system and method of the present invention may be used in any structure of the wind turbine in which the control and power electronics are housed, such as the nacelle 102, and are not limited to the tower 104.

Referring now to FIG. 2, a schematic view of an exemplary electrical and control system containing various power components that may be used with the wind turbine 100 of FIG. 1 is illustrated. During operation, wind impacts the blades 108 and the blades 108 transform wind energy into a mechanical rotational torque that rotatably drives a low-speed shaft 114 via the hub 110. The low-speed shaft 114 is configured to drive a gearbox 112 that subsequently steps up the low rotational speed of the low-speed shaft 114 to drive a high-speed shaft 116 at an increased rotational speed. The high-speed shaft 116 is generally rotatably coupled to a generator 118 so as to rotatably drive a generator rotor 122. In one embodiment, the generator 118 may be a wound rotor, three-phase, double-fed induction (asynchronous) generator (DFIG) that includes a generator stator 120 magnetically coupled to a generator rotor 122. As such, a rotating magnetic field may be induced by the generator rotor 122 and a voltage may be induced within a generator stator 120 that is magnetically coupled to the generator rotor 122. In another embodiment, the generator 118 is configured to convert the rotational mechanical energy to a sinusoidal, three-phase alternating current (AC) electrical energy signal in the generator stator 120. The associated electrical power can be transmitted to a main transformer 160 via a stator bus 126, a stator synchronizing switch 154, and a stator bus circuit breaker 156. The main transformer 160 steps up the voltage amplitude of the electrical power such that the transformed electrical power may be further transmitted to a grid via a breaker-side bus 180 and a grid circuit breaker 158.

In addition, the generator 118 is typically coupled to a power converter 130 via a rotor bus 124. More specifically, as shown, the generator 118 is coupled to a rotor side converter 132 via the rotor bus 124. The rotor side converter 132 is coupled to a line side converter 134 which in turn is coupled to a line side bus 138.

In exemplary configurations, the rotor side converter 132 and the line side converter 134 are configured for normal operating mode in a three-phase, pulse width modulation (PWM) arrangement using insulated gate bipolar transistors 168 (IGBTs) (FIG. 4) as switching devices. Other suitable switching devices can be used, such as insulated gate commuted thyristors, MOSFETs, bipolar transistors, silicon controlled rectifiers, or other suitable switching devices. The rotor side converter 132 and the line side converter 134 can be coupled via a DC link 135 across which is the DC link capacitor 136.

The power converter 130 can be coupled to a controller 140 to control the operation of the rotor side converter 132 and the line side converter 134. For instance, the controller 140 can send control commands to the rotor side converter 132 and line side converter 134 to control the modulation of switching elements (such as IGBTs) used in the power converter 130 to provide a desired real and reactive power output. The controller 140 can be any suitable control circuit. In particular, referring now to FIG. 3, it should be appreciated that the controller 140 may generally include a computer or any other suitable processing unit. Thus, in several embodiments, the controller 140 may include one or more processor(s) 142 and associated memory device(s) 144 configured to perform a variety of computer-implemented functions, as discussed herein. As used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. Additionally, the memory device(s) 144 of the controller 140 may generally include memory element(s) including, but are not limited to, computer readable medium (e.g., random access memory (RAM)), computer readable non-volatile medium (e.g., a flash memory), a floppy disk, a compact disc-read only memory (CD-ROM), a magneto-optical disk (MOD), a digital versatile disc (DVD) and/or other suitable memory elements. Such memory device(s) 144 may generally be configured to store suitable computer-readable instructions that, when implemented by the processor(s), configure the controller 140 to perform various computer-implemented functions including, but not limited to, performing proportional integral derivative ("PID") control algorithms, including various calculations within one or more PID control loops, and various other suitable computer-implemented functions. In addition, the controller 140 may also include various input/output channels for receiving inputs from sensors and/or other measurement devices and for sending control signals to various components of the wind turbine system 100. Additionally, the controller 140 may also include a communications module 146 to facilitate communications between the controller 140 and the various components of the wind turbine system 100. Moreover, the communications module 146 may include a sensor interface 148 (e.g., one or more analog-to-digital converters) to permit input signals transmitted from, for example, various sensors located within the wind turbine system 100, to be converted into signals that can be understood and processed by the processors 142.

Referring back to FIG. 2, the system 100 also includes a transformer 160 coupling the wind turbine system 100 to an electrical grid 180. It should be understood that the transformer 160 can be a three-winding transformer as shown, or alternatively may be a two-winding transformer having only a primary winding and a secondary winding; may be a four-winding transformer having a primary winding, a secondary winding, an auxiliary winding, and an additional auxiliary winding; or may have any other suitable number of windings.

An auxiliary power feed 170 may also be coupled to the output of the power converter 130. The auxiliary power feed 170 acts as a power source for various components of the wind turbine system 100. For instance, the auxiliary power feed 170 can power fans, pumps, motors, and other suitable components of the wind turbine system 100.

In operation, power generated at the generator 118 by rotating the rotor 106 is provided via a dual path to the electrical grid 180. The dual paths are defined by the stator bus 126 and the rotor bus 124. On the rotor-bus side, sinusoidal multi-phase (e.g. three-phase) alternating current (AC) power is provided to the power converter 130. The rotor side power converter 132 converts the AC power provided from the rotor bus 124 into direct current (DC) power and provides the DC power to the DC link 135. Switching devices (e.g. IGBTs) used in parallel bridge circuits of the rotor side power converter 132 can be modulated to convert the AC power provided from the rotor bus 124 into DC power suitable for the DC link 135.

The line side converter 134 converts the DC power on the DC link 135 into AC power at a frequency suitable for the electrical grid 180. In particular, switching devices (e.g. IGBTs) used in bridge circuits of the line side power converter 134 can be modulated to convert the DC power on the DC link 135 into AC power on the line side bus 138. The power from the power converter 130 can be provided via the transformer 160 to the electrical grid 180.

The power converter 130 can receive control signals from, for instance, the controller 140. The control signals can be based, among other things, on sensed conditions or operating characteristics of the wind turbine system 100. For instance, the control signals can be based on sensed voltage associated with the transformer 160 as determined by a voltage sensor. As another example, the control signals can be based on sensed voltage associated with the auxiliary power feed 170 as determined by a voltage sensor.

Typically, the control signals provide for control of the operation of the power converter 130. For example, feedback in the form of sensed speed of the generator 118 can be used to control the conversion of the output power from the rotor bus 124 to maintain a proper and balanced multi-phase (e.g. three-phase) power supply. Other feedback from other sensors can also be used by the controller 140 to control the power converter 130, including, for example, stator and rotor bus voltages and current feedbacks. Using the various forms of feedback information, switching control signals (e.g. gate timing commands for IGBTs), stator synchronizing control signals, and circuit breaker signals can be generated.

On the stator-bus side, sinusoidal multi-phase (e.g. three-phase) alternating current (AC) power is provided from the stator 120 of the generator 118 to the stator bus 126 and from the stator bus 126 to the transformer 160. Further, a stator synchronizing switch 154 may be coupled between the stator bus 126 and the transformer 160. The switch 154 may connect and disconnect the stator bus 126 and transformer 160 as required, and may thus provide grid isolation during, for example, low wind speed periods, excessive wind speed periods, or other critical operational periods.

Still referring to FIG. 2, various circuit breakers, fuses, contactors, and other devices, such as grid circuit breaker 158, stator bus circuit breaker 156, and line bus circuit breaker 152, can be included in the system 100 to connect or disconnect corresponding buses, for example, when current flow is excessive and can damage components of the wind turbine system 100 or for other operational considerations. Additional protection components can also be included in the wind turbine system 100.

Referring now to FIG. 4, a detailed view of one embodiment of the power converter 130, particularly illustrating various electrical components of the power converter 130, is illustrated. As shown, the power converter 130 includes the rotor side converter 132 and the line side converter 134. In addition, as shown, the rotor side converter 132 corresponds to a DC-AC converter and the line side converter 134 corresponds to an AC-DC converter. Each converter 132, 134 is configured for normal operating mode in a three-phase, PWM arrangement using IGBTs 168 as switching devices. As mentioned, other suitable switching devices can be used, such as insulated gate commuted thyristors, MOSFETs, bipolar transistors, silicon controlled rectifiers, or other suitable switching devices. The rotor side converter 132 and the line side converter 134 are coupled via the DC link 135 across which is the DC link capacitor 136. In addition, a dynamic brake 162 may be provided in the power converter 130 between the rotor side converter 132 and the line side converter 134. The dynamic brake 162, when gated on, absorbs energy in the converter 130. For example, in exemplary embodiments as shown, the dynamic brake 162 may include a resistor 164 in series with a switch 166, which may for example be an IGBT. The power converter 130 may also include one or more power filters 172 containing one or more electrical components. For example, as shown, the filters 172 may include an inductor 176 and a capacitor 178.

Referring now to FIG. 5, a schematic diagram of one embodiment of a system 200 for cooling one or more electrical components of the power converter 130 is illustrated. As shown, the single-phase system 200 includes an immersion tank 202 containing a cooling medium 204. The immersion tank 202 may be any suitable tank or bath configured to receive one or more of the electrical components of the power converter 130. For example, in one embodiment, the immersion tank 202 may be sized to receive the entire power converter 130 therein such that all components of the power converter 130 are submerged in the cooling medium 204 during operation. Alternatively, the immersion tank 202 may be sized to receive only certain components of the power converter 130, e.g. only those components requiring a certain level of cooling or those components less likely to fail during operation. For example, in one embodiment, only the inductor(s) and/or the transformer may be submerged in the cooling medium 204 since such components rarely fail. In such an embodiment, costs associated with the cooling medium 204 (e.g. price/gallon) may be minimized. In still additional embodiments, the immersion tank 202 may be designed so as to minimize the amount of cooling medium 204 that touches heat dissipating parts of the electrical components. For example, in certain embodiments, this may be accomplished by placing only those components having high heat dissipation characteristics in the cooling medium 204 or by using a heat conductive medium (e.g. metal) to transfer the heat from the electrical components into the cooling medium 204.

In addition, it should be understood that the immersion tank 202 may be constructed of any suitable material. For example, in a particular embodiment, the immersion tank 202 may be constructed of a ceramic material or any other suitable electrically-insulating inert material. In another embodiment, the immersion tank 202 may be constructed of a metal material or any other suitable electrically-conducting inert material. In still additional embodiments, the immersion tank 202 may contain internal barriers and/or dividers that create separate compartments within the immersion 202 and direct the flow of the cooling medium 204. For example, in one embodiment, the electrical components described herein may be contained in separate compartments of the immersion tank 202 such that the cooling medium 204 flows into certain components and not in others. Thus, some of the electrical components may be at least partially submerged while others remain out of the cooling medium 204. Alternatively, the immersion tank 202 may be built without internal barriers and/or dividers.

The cooling medium 204 as described herein may be any suitable cooling fluid that is configured to provide cooling to the electrical components without damaging the components when submerged therein during operation. Accordingly, in certain embodiments, the cooling medium 204 is not electrically conductive or chemically aggressive. Thus, the electric circuits can be submerged in the cooling medium 204 without causing any change to the electrical properties and without causing damage to the components. In additional embodiments, the cooling medium 204 is thermally conductive, which assists with heat removal from the electronic circuits while submerged within the cooling medium 204. In still further embodiments, the cooling medium 204 has a low boiling point, which provides an effective way to dissipate the heat from the components and a more efficient heat transfer mechanism. In additional embodiments, the boiling temperatures can be coordinated with the temperature control requirements of the components being cooled. For example, fluids used for two-phase cooling will have a pressure associated with the boiling temperature. Thus, the immersion tank must be designed to handle the pressure taking into account cost considerations. Further, boiling point is typically defined as a curve consisting of points which are ordered pairs of temperature and pressure.

The cooling medium 204 may also have a relatively high dielectric constant over time. The dielectric constant or relative permittivity relates to the electrical insulating properties of a fluid. For example, in one embodiment, the dielectric constant of the cooling medium 204 may be at least 2, more preferably from about 2.2 to about 2.5. In still additional embodiments, the dielectric constant may be greater than 2.5 or less than 2.2. Since the long-term chemical reactions of metals touching the cooling medium 204 may reduce the electrical insulating properties of the fluid, the higher the dielectric constant, the better. More specifically, the higher the dielectric constant, the smaller the spacing between electrical components of the power converter 130 and therefore, the smaller power converter and potentially, the higher the switching frequency. Accordingly, in one embodiment, the power converter 130 can be designed with electrical spacings that are coordinated with the electrical insulating properties of the fluid. Electrical spacings may consider that the cooling medium 204 between points of different voltage may be in liquid and gaseous states. As such, the insulating properties are designed to be stable over time so that the electrical spacings used are sufficient over time. In still another embodiment, the cooling medium 204 may have a certain dielectric strength, which generally refers to the maximum electric field that the cooling medium 204 can withstand under ideal conditions without breaking down. For example, in a certain embodiment, the cooling medium 204 may have a dielectric strength of at least 10 megavolts per meter (MV/m). Another way to stabilize the fluid dielectric constant over a longer period of time is to add a molecular sieve, which is generally defined as a container of particles that act as a filter by absorbing metal ions that pass through.

In a particular embodiment, 3M™'s Novec™ Engineered Fluid may be used as the cooling medium 204, which is an efficient dielectric that is capable of cooling the electrical components of the power converter 130 with minimum additional energy, maximum performance, and better reliability. Further, 3M™'s Novec™ fluid has a dielectric constant ranging from about 1.8 to about 8 and a dielectric strength of about 15 MV/m. In additional embodiments, the cooling medium 204 may be any other suitable cooling fluid having similar properties as the 3M™ Novec™ fluid.

Referring still to FIG. 5, the system 200 also includes a heat exchanger 206 in fluid communication with the cooling medium 204. In various embodiments, the heat exchanger 206 may be any suitable heat exchanger configured to transfer or exchange heat from the cooling medium 204 to a separate medium within the heat exchanger. For example, in certain embodiments, the heat exchanger 206 may be a condenser, a double pipe heat exchanger, a shell and tube heat exchanger, a plate heat exchanger, or any other suitable heat exchanger now known or later developed in the art. In addition, if the heat is to be rejected locally, than a vapor-to-air heat exchanger can be used, whereas if the heat is to be rejected remotely, then a vapor-to-liquid heat exchanger can be used.

In addition, the system 200 may optionally include a pumping device 210 configured to circulate the cooling medium 204 between the immersion tank 202 and the heat exchanger 206 to remove heat from the electrical component(s). More specifically, as shown, certain electrical components 164, 168, 176 of the power converter 130 are placed into the immersion tank 202 and submerged within the cooling medium 204. During operation, the cooling medium 204 removes or absorbs heat generated by the electrical components 164, 168, 176 and the pumping device 210 circulates the heated cooling medium 204 through the heat exchanger 206. The heat exchanger 206 then disperses excess heat into ambient air and the cooled cooling medium is circulated back into the immersion tank 202 via the pumping device 210.

It should be understood that the pumping device 210 as described herein may be any suitable pumping device now known or later developed in the art. For example, in certain embodiments, the pumping device 210 may be a centrifugal pump, a rotor-dynamic pump, a positive displacement pump, or any other suitable pumping device. In addition, the pumping device 210 may be a fixed-speed pump or a variable-speed pump. In certain embodiments, by using a variable-speed pump, the pumping device 210 can be operated at a speed that is just fast enough to provide the desired level of cooling of the cooling medium 204, thereby reducing power losses of the pump. Thus, in various embodiments, variable-speed pumps can improve cooling system efficiency.

Referring now to FIG. 6, a schematic diagram of one embodiment of a two-phase system 200 for cooling electrical component(s) of the power converter 130 is illustrated. As shown, the system 200 includes immersion tank 202 containing cooling medium 204. Like the embodiment of FIG. 5, one or more of the electrical components (e.g. 164, 168, 176) of the power converter 130 can be fully or partially submerged within the cooling medium 204. The system 200 also includes at least two heat exchangers, namely condenser 216 and heat exchanger 218. The condenser 216 is in fluid communication with the cooling medium 204 and the heat exchanger 218 is in fluid communication with a separate external coolant 214. More specifically, as shown, the cooling medium 204 removes heat from the electrical components 164, 168, 176 and vapor generated by the cooling medium 204 rises to the condenser 216. The condenser 216 condenses/cools the vapor and the cooled cooling medium 204 flows back down into the immersion tank 204. In addition, the condenser 216 dispels heat to the external coolant 214 and the external coolant 214 circulates through the heat exchanger 218. The heat exchanger 218 then disperses excess heat into ambient air remotely.

Referring now to FIG. 7, a schematic diagram of another embodiment of a two-phase system 200 is illustrated according to the present disclosure. As shown, the system 200 includes immersion tank 202 containing cooling medium 204. Like the embodiments of FIGS. 5 and 6, one or more of the electrical components 164, 168, 176 of the power converter 130 are fully or partially submerged within the cooling medium 204. The system 200 also includes the heat exchanger 216 in fluid communication with the cooling medium 204 of the immersion tank 202. Thus, as shown, the cooling medium 204 removes heat from the electrical components 164, 168, 176 and vapor generated by the cooling medium 204 rises to the heat exchanger 216. The heat exchanger 216 then condenses the vapor and disperses excess heat into ambient air locally. The cooled cooling medium 204 can then be circulated back into the immersion tank 202 by gravity.

In still additional embodiments, as the systems described herein are typically located in outdoor environments, the systems can be configured to start-up in various temperature conditions, including, for example, temperatures ranging from about −30° C. to about 50° C. ambient air temperature. Thus, the system 200 may include one or more controlled fans and/or heaters to assist with start-up of the system 200. For example, in cold-temperature startup, heat can be applied to warm the system 200 before voltage is applied to the electrical components. More specifically, in one embodiment, the heater(s) may be configured to heat the immersion tank 202 upon start-up of the system 200. In a further embodiment, the heater(s) may be configured within the immersion tank 202. Alternatively, the heater may be designed into the electrical circuit of the power converter 130. In addition, the controlled fans can be added to the system 200 to assist with start-up of the system 200. For example, if the fan is not running, heat stays in the system 200. If the fan is running, than the heat can leave the system 200. In certain components, the system 200 may also include one or more valves (e.g. bypass values, etc.) and/or other components if needed. Further, cooling systems are designed to provide system cooling at the maximum ambient air temperature. Thus, at cooler ambient air temperatures, the heat exchangers can become too powerful and the electrical component life can become affected by temperature cycles. If the fans are operated at slower speeds at cooler ambient air temperatures, the system components can operate at more constant temperatures.

The systems and methods described herein have a higher critical heat flux over prior art systems. The critical heat flux as described herein is a fluid and surface phenomena and has the units of watts per area. More specifically, the critical heat flux generally describes the thermal limit of a phenomenon where a phase change occurs during heating (such as bubbles forming on a metal surface used to heat water), which suddenly decreases the efficiency of heat transfer, thus causing localized overheating of the heating surface. In one example, the critical heat flux is when a boiling liquid transfers from producing small bubbles (i.e. nucleate boiling) to large bubbles (i.e. film boiling). With film boiling, the fluid is less in contact with the surface and heat transfer is reduced dramatically. Thus, the critical heat flux can be increased by optimizing the texture of the surface. For example, in one embodiment, the critical heat flux of the electrical components can be increased by adding texture to the surface. More specifically, the electrical components of the power converter 130 have a critical heat flux limit of about 35 to about 40 watts per centimeters squared ($W/cm^2$), e.g. about 38 $W/cm^2$. Further, the critical heat flux of the cooling medium 204 may be from about 12 to about 15 $W/cm^2$, which equates to a design heat flux value of about 10 $W/cm^2$ without surface modification. Having a higher critical heat flux is beneficial because the electrical components of the power converter 130 have a relatively low mass and typically do not have much overload capabilities. As such, by submerging the electrical components in the cooling medium 204, the size and costs of the components can be greatly reduced. In addition, the submerged electrical components can operate at lower temperatures, thereby improving their reliability.

Referring now to FIG. 8, a flow diagram of a method 300 for cooling one or more electrical components of a current conversion device of a renewable energy power system is illustrated. As shown, at 302, the method 300 includes submerging one or more of the electrical components of the current conversion device at least partially within a cooling medium contained in an immersion tank. At 304, the method 300 includes circulating the cooling medium from the immersion tank through at least one heat exchanger. At 306, the method 300 includes cooling the cooling medium via the heat exchanger. At 308, the method 300 includes dispersing the heat removed by the heat exchanger from the cooling medium into ambient air. At 310, the method 300 includes circulating the cooling medium from the heat exchanger back to the immersion tank.

It should be understood that the cooling system 200 described herein, though described in reference to a wind turbine system 100 can also be used in any other renewable power energy system, such as, e.g. a solar power system.

While the present subject matter has been described in detail with respect to specific exemplary embodiments and methods thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A cooling system for a wind turbine having a tower, the cooling system comprising:
    a power converter located within the tower of the wind turbine, the power converter comprising a plurality of electrical components of the wind turbine, the plurality of electrical components comprising at least one insulated-gate bipolar transistor (IGBT), at least one capacitor, at least one resistor, and at least one inductor;
    an immersion tank comprising a cooling medium, the immersion tank located within the tower of the wind turbine, the plurality of electrical components of the power converter being at least partially submerged within the cooling medium, the cooling medium comprising a dielectric strength of at least 10 megavolts per meter (MV/m);
    at least one heat exchanger in fluid communication with the cooling medium of the immersion tank; and,
    a pumping device that circulates the cooling medium from the immersion tank to the at least one heat exchanger and back to the immersion tank to remove heat from the plurality of electrical components of the power converter, wherein the at least one heat exchanger disperses the heat removed from the plurality of electrical components into ambient air,
    wherein the plurality of electrical components have a predetermined spacing within the immersion tank that is determined based on the dielectric strength of the cooling medium.

2. The cooling system of claim 1, wherein each of the plurality of electrical components of the power converter are at least partially submerged within the cooling medium.

3. The cooling system of claim 1, wherein the cooling medium comprises a critical heat flux of at least about 10 W/cm$^2$.

4. The cooling system of claim 1, further comprising one or more fans configured to assist with start-up of the wind turbine.

5. The cooling system of claim 1, further comprising one or more heaters configured to heat the immersion tank upon start-up of the wind turbine.

6. A method for cooling a plurality of electrical components of a power converter of a wind turbine, the method comprising:
    submerging the plurality of electrical components of the power converter at least partially within a cooling medium contained in an immersion tank, the plurality of electrical components comprising at least one insulated-gate bipolar transistor (IGBT), at least one capacitor, at least one resistor, and at least one inductor, the cooling medium comprising a dielectric strength of at least 10 megavolts per meter (MV/m);
    spacing the plurality of electrical components within the immersion tank based on the dielectric strength of the cooling medium;
    placing the immersion tank with the plurality of electrical components submerged therein within a tower of the wind turbine;
    circulating the cooling medium from the immersion tank through at least one heat exchanger via at least one pumping device;
    cooling the cooling medium via the at least one heat exchanger;
    dispersing heat removed by the at least one heat exchanger from the cooling medium into ambient air; and,
    circulating the cooling medium from the at least one heat exchanger back to the immersion tank via the at least one pumping device.

7. The method of claim 6, further comprising submerging each of the plurality of electrical components of the power converter at least partially within the cooling medium contained in the immersion tank.

8. The method of claim 6, wherein the cooling medium comprises a critical heat flux of at least about 10 W/cm$^2$.

* * * * *